(12) United States Patent
Morino et al.

(10) Patent No.: US 10,446,649 B2
(45) Date of Patent: Oct. 15, 2019

(54) SILICON CARBIDE SEMICONDUCTOR DEVICE

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Tomoo Morino, Anjo (JP); Shoji Mizuno, Okazaki (JP); Yuichi Takeuchi, Obu (JP); Akitaka Soeno, Toyota (JP); Yukihiko Watanabe, Nagoya (JP)

(73) Assignees: DENSO CORPORATION, Kariya (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 18 days.

(21) Appl. No.: 14/652,483

(22) PCT Filed: Dec. 19, 2013

(86) PCT No.: PCT/JP2013/007458
§ 371 (c)(1),
(2) Date: Jun. 16, 2015

(87) PCT Pub. No.: WO2014/118859
PCT Pub. Date: Aug. 7, 2014

(65) Prior Publication Data
US 2015/0333127 A1 Nov. 19, 2015

(30) Foreign Application Priority Data
Jan. 31, 2013 (JP) .................... 2013-017147

(51) Int. Cl.
*H01L 29/16* (2006.01)
*H01L 29/78* (2006.01)
(Continued)

(52) U.S. Cl.
CPC ........ *H01L 29/1608* (2013.01); *H01L 21/761* (2013.01); *H01L 27/088* (2013.01);
(Continued)

(58) Field of Classification Search
CPC ............ H01L 29/7813; H01L 29/1095; H01L 29/41766
See application file for complete search history.

(56) References Cited

U.S. PATENT DOCUMENTS

| 5,621,601 A | 4/1997 | Fujihira et al. |
| 5,719,409 A | 2/1998 | Singh et al. |

(Continued)

FOREIGN PATENT DOCUMENTS

| JP | 2002-246459 A | 8/2002 |
| JP | 2011-228934 A | 11/2011 |
| WO | 2010/137167 A1 | 12/2010 |

OTHER PUBLICATIONS

International Search Report and Written Opinion of the International Searching Authority dated Mar. 25, 2014 issued in the corresponding International application No. PCT/JP2013/007458 (and English translation).
Office Action dated Aug. 5, 2015 in the corresponding TW application No. 103101275 (With English translation).

*Primary Examiner* — Samuel A Gebremariam
*Assistant Examiner* — Jonas T Beardsley
(74) *Attorney, Agent, or Firm* — Posz Law Group, PLC

(57) ABSTRACT

A silicon carbide semiconductor device includes: an element isolation layer and an electric field relaxation layer. The element isolation layer is arranged, from the surface of a base region to be deeper than the base region, between a main cell region and a sense cell region, and isolates the main cell region from the sense cell region. The electric field relaxation layer is arranged from a bottom of the base region to be deeper than the element isolation layer. The electric (Continued)

field relaxation layer is divided into a main cell region portion and a sense cell region portion. At least a part of the element isolation layer is arranged inside of a division portion of the electric field relaxation layer.

19 Claims, 8 Drawing Sheets

(51) Int. Cl.
*H01L 29/10* (2006.01)
*H01L 27/088* (2006.01)
*H01L 29/12* (2006.01)
*H01L 21/761* (2006.01)
*H01L 29/06* (2006.01)

(52) U.S. Cl.
CPC ...... *H01L 29/0615* (2013.01); *H01L 29/0642* (2013.01); *H01L 29/1095* (2013.01); *H01L 29/12* (2013.01); *H01L 29/78* (2013.01); *H01L 29/7813* (2013.01); *H01L 29/7815* (2013.01)

(56) References Cited

U.S. PATENT DOCUMENTS

| | | | |
|---|---|---|---|
| 6,180,966 | B1 | 1/2001 | Kohno et al. |
| 8,704,295 | B1* | 4/2014 | Darwish ............. H01L 29/7806 257/330 |
| 2002/0017697 | A1* | 2/2002 | Kitamura ............ H01L 21/8249 257/492 |
| 2003/0042538 | A1 | 3/2003 | Kumar et al. |
| 2004/0195618 | A1* | 10/2004 | Saito ................... H01L 29/0634 257/330 |
| 2006/0076613 | A1 | 4/2006 | Ohyanagi et al. |
| 2006/0278920 | A1 | 12/2006 | Kim |
| 2006/0289928 | A1* | 12/2006 | Takaya ................ H01L 29/0623 257/330 |
| 2009/0263948 | A1 | 10/2009 | Kim |
| 2010/0219785 | A1 | 9/2010 | Hirose et al. |
| 2011/0297934 | A1 | 12/2011 | Soeno |
| 2012/0153303 | A1* | 6/2012 | Uchida ............. H01L 29/41766 257/77 |
| 2012/0248462 | A1 | 10/2012 | Wada et al. |
| 2012/0313112 | A1 | 12/2012 | Wada et al. |
| 2014/0097489 | A1* | 4/2014 | Roig-Guitart ..... H01L 29/66712 257/330 |

\* cited by examiner

SILICON CARBIDE SEMICONDUCTOR DEVICE

CROSS REFERENCE TO RELATED APPLICATION

This application is a U.S. national stage of International Application No. PCT/JP2013/007458 filed on Dec. 19, 2013 and is based on Japanese Patent Application No. 2013-17147 filed on Jan. 31, 2013, the disclosures of which are incorporated herein by reference.

TECHNICAL FIELD

The present disclosure relates to a silicon carbide (hereinafter referred to as "SiC") semiconductor device that detects a current flowing in a main cell by a sense cell.

BACKGROUND ART

Patent Literature 1 discloses an SiC semiconductor device that divides a semiconductor element into a main cell and a sense cell, and detects a current flowing in the main cell by a sense cell. In the SiC semiconductor device, an $n^+$ type punch-through stopper layer into which n-type impurities are ion-implanted is formed between the main cell in which a vertical field effect transistor is formed and the sense cell in which a heterojunction diode is formed. An element isolation is performed between the main cell and the sense cell due to the $n^+$ type punch-through stopper layer.

Prior Art Literatures

Patent Literature

Patent Literature 1: JP-2006-093382 A (corresponding to U.S. Pat. No. 7,307,313)

SUMMARY OF INVENTION

Object to be Solved

When an SiC semiconductor device in which an n-channel vertical MOSFET is formed in each of the main cell and the sense cell is configured, it is conceivable that the element isolation between the main cell and the sense cell is performed by a structure illustrated in FIG. 7A. That is, a structure in which a p-type base region J3 is formed on a surface or an upper layer part of an $n^-$ type drift layer J2 on an $n^+$ type SiC substrate 31, and an element isolation layer J4 deeper than the p-type base region 33 is formed so as to isolate the p-type base region, thereby performing the element isolation is assumed.

However, a problem that electric field concentration is generated on a bottom of the element isolation layer 34, and a breakdown voltage structure is not sufficient may occur. For that reason, the present inventors have proposed that a p-type field relaxation layer J5 is formed in a lower layer of the p-type base region J3 to cover the bottom of the element isolation layer J4, and the electric field concentration on the bottom of the element isolation layer J4 is relaxed to obtain a sufficient breakdown voltage structure, as illustrated in FIG. 7B. However, when the p-type field relaxation layer 35 is formed below the element isolation layer J4, the main cell and the sense cell are rendered conductive through the p-type field relaxation layer J5, and the element isolation between those cells is not performed.

Therefore, in view of the above circumstances, the present disclosure aims at providing a silicon carbide semiconductor device which is capable of relaxing the electric field concentration below the element isolation layer while properly performing the element isolation between the main cell and the sense cell with the formation of an element isolation layer between those cells, and preventing the main cell and the sense cell from being rendered conductive.

Means for Achieving Object

According to an aspect of the present disclosure, a silicon carbide semiconductor device includes: a plurality of MOSFETs that are respectively arranged in a main cell region and a sense cell region; an element isolation layer; and an electric field relaxation layer. Each of the MOSFETs includes: a semiconductor substrate; a base region; a source region; a gate insulating film; a gate electrode; a source electrode; and a drain electrode.

The semiconductor substrate includes a high concentration impurity layer on a rear surface side of the substrate and a drift layer with an impurity concentration lower than the high concentration impurity layer on a front surface side of the substrate, and is made of silicon carbide having a first conductivity type. The base region is arranged on the drift layer, and is made of silicon carbide having a second conductivity type. The source region is arranged in an upper layer part of the base region, and is made of silicon carbide having the first conductivity type with an impurity concentration higher than the drift layer. The gate insulating film is arranged on a surface of a channel region disposed in a surface layer part or on a surface of a portion of the base region located between the source region and the drift layer. The gate electrode is arranged on a surface of the gate insulating film. The source electrode is electrically connected to the source region. The drain electrode is electrically connected to the high concentration impurity layer on the rear surface side of the semiconductor substrate.

The element isolation layer is arranged, from the surface of the base region to be deeper than the base region, between the main cell region and the sense cell region, and isolates the main cell region from the sense cell region. The electric field relaxation layer has the second conductivity type, and is arranged from a bottom of the base region to be deeper than the element isolation layer. The electric field relaxation layer is divided into a main cell region portion and a sense cell region portion. At least a part of the element isolation layer is arranged inside of a division portion of the electric field relaxation layer.

In the silicon carbide semiconductor device, the electric field concentration below the element isolation layer can be relaxed by the electric field relaxation layer while accurately performing the element isolation between the main cell region and the sense cell region by the element isolation layer. Further, the main cell region and the sense cell region can be prevented from being rendered conductive by the electric field relaxation layer.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Embodiments of the present disclosure will be described below with reference to the drawings. In the following respective embodiments, parts identical with or equivalent to each other are denoted by the same symbols for description.

First Embodiment

A first embodiment of the present disclosure will be described. In this example, an SiC semiconductor device having MOSFETs of an inversion type trench gate structure will be described as a semiconductor element.

Figure 1:
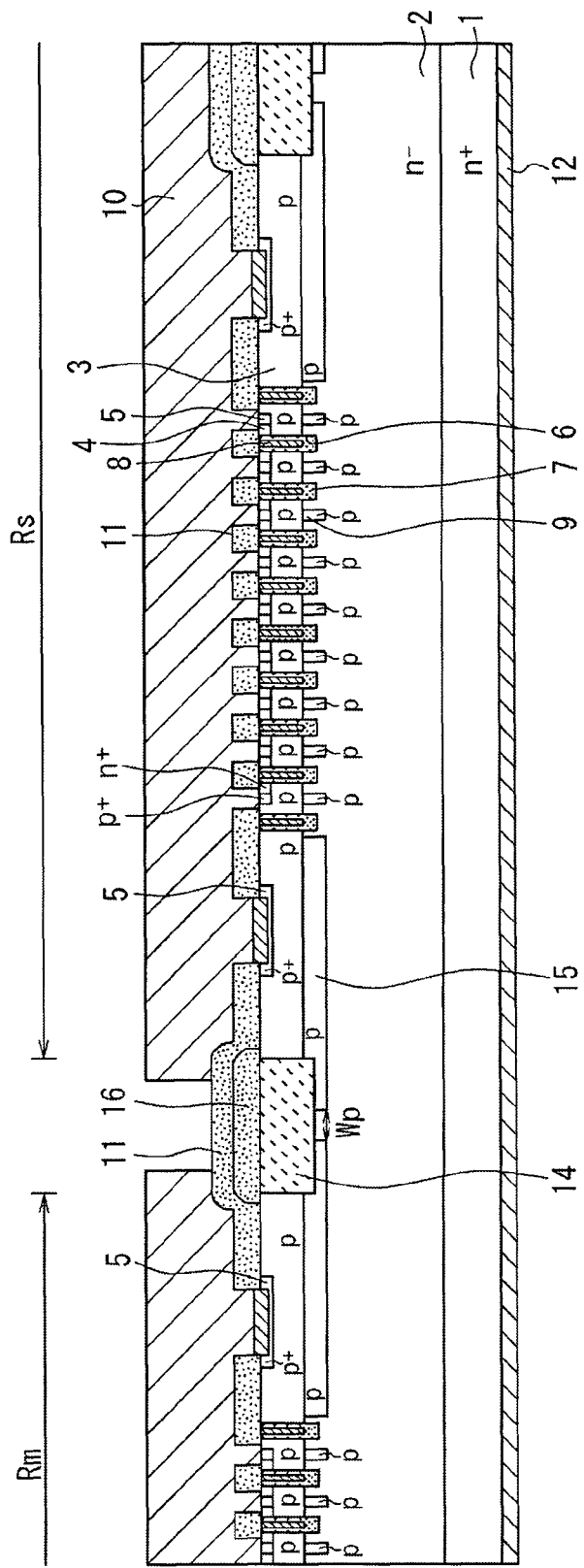
FIG. 1 is a cross-sectional view of an SiC semiconductor device according to a first embodiment of the present disclosure.

As illustrated in FIG. 1, the SiC semiconductor device according to this embodiment has a configuration having a region (hereinafter referred to as "main cell region") Rm forming a main cell and a region (hereinafter referred to as "sense cell region") Rs forming a sense cell. Those regions Rm and Rs are each provided with an MOSFET of the inversion trench gate structure having the same structure, and the respective regions Rm and Rs are element-isolated from each other, and electrically isolated from each other.

Specifically, the SiC semiconductor device according to this embodiment is formed of a semiconductor substrate in which an $n^-$ type drift layer 2 made of SiC having an impurity concentration lower than that of an $n^+$ type substrate 1 is formed on a surface side of the $n^+$ type substrate 1 configuring a high concentration impurity layer made of SiC. A p-type base region 3 made of SiC having a higher impurity concentration than that of the $n^-$ type drift layer 2 is formed on an upper layer part of the $n^-$ type drift layer 2. Further, $n^+$ type source regions 4 and $p^+$ type contact regions 5 are formed in an upper layer portion of the p-type base region 3. The $n^+$ type source region 4 is arranged on both sides of a trench gate structure to be described later, and the $p^+$ type contact regions 5 are disposed on the opposite sides of the trench gate structure across the $n^+$ type source regions 4.

Trenches 6 are formed to reach the $n^-$ type drift layer 2 through the p-type base region 3 and the $n^+$ type source regions 4 with a direction perpendicular to a paper plane as a longitudinal direction thereof. The p-type base region 3 and the $n^+$ type source regions 4 described above are arranged to come in contact with side surfaces of the trenches 6.

Further, with a surface layer part of a portion of the p-type base region 3 located between each of the $n^+$ type source regions 4 and the $n^-$ type drift layer 2 as a channel region, a gate insulating film 7 is formed on an inner wall surface of the trench 6. A gate electrode 8 made of doped poly-Si is formed on a surface of the gate insulating film 7, and each of the trenches 6 is embedded with the gate insulating film 7 and a gate electrode 8.

The trench gate structure is configured as described above. The trench gate structure extends with the direction perpendicular to the paper plane in FIG. 1 as a longitudinal direction, and the plural trench gate structures are aligned in a lateral direction of FIG. 1 into stripes. The $n^+$ type source regions 4 and the $p^+$ type contact regions 5 described above have a structure to extend along the longitudinal direction of the trench gate structures.

Further, p-type deep layers 9 aligned in parallel to the longitudinal direction of the trenches 6 between the trenches 6 in the trench gate structures, at positions of the $n^-$ type drift layer 2 lower than the p-type base region 3. The p-type deep layers 9 are formed to be deeper than bottoms of the trenches 6, and a p-type impurity concentration such as boron or aluminum is set to, for example, $1.0 \times 10^{17}/cm^3$ to $1.0 \times 10^{19}/cm^3$.

A source electrode 10 and gate lines (not shown) are formed on surfaces of the n+ type source regions 4 and the p+ type contact regions 5, and the surface of the gate electrode 8. The source electrode 10 and the gate lines are made of plural metals (for example, Ni/Al, etc.). Portions of the source electrode 10 and the gate lines which come in contact with at least n-type SiC (specifically, n+ type source regions 4 and gate electrode 8 of the n-type dope) is made of metal that can come in ohmic contact with the n-type SiC. Portions of the source electrode 10 and the gate lines which come in contact with at least p-type SiC (specifically, p+ type contact regions 5 and gate electrode 8 of p-type dope) are made of metal that can come in ohmic contact with the p-type SiC. The source electrode 10 and the gate lines are formed on an interlayer insulating film 11, and electrically insulated from each other. The source electrode 10 is electrically connected to the n+ type source regions 4 and the p+ type contact regions 5 through contact holes formed in the interlayer insulating film 11, and the gate lines are brought in electric contact with the gate electrodes 8.

A drain electrode 12 electrically connected to the n+ type substrate 115 formed on a rear side of the n+ type substrate 1. With the above configuration, an MOSFET having an inverting trench gate structure of the n-channel type is configured, the MOSFET having the same structure is formed in both of the main cell region Rm and the sense cell region Rs. An cell area (the number of cells) of the inverting MOSFETs provided in the main cell region Rm and the sense cell region Rs is set to a predetermined ratio.

An element isolation layer 14 is formed to a position deeper than the p-type base region 3 from the surface of the p-type base region 3 between the main cell region Rm and the sense cell region Rs. The element isolation layer 14 performs element isolation, that is, electric isolation between the main cell region Rm and the sense cell region Rs, and is formed of an insulating film such as an oxide film or an n-type layer which is opposite in conduction type to the p-type base region 3.

Further, in the vicinity of the sense cell region Rs in the main cell region Rm, and in the vicinity of the main cell region Rm in the sense cell region Rs, portions in which no MOSFET is formed are provided. An electric field relaxation layer 15 formed of a p-type layer is formed below the p-type base region 3 in those regions. The electric field relaxation layer 15 is formed to a position deeper than the element isolation layer 14, and a bottom of the element isolation layer 14 is located between a bottom of the p-type base region 3 and the bottom of the electric field relaxation layer 15. For that reason, an electric field concentration on the bottom of the element isolation layer 14 can be relaxed by the electric field relaxation layer 15 to obtain a sufficient breakdown voltage structure.

The electric field relaxation layer 15 is isolated on the bottom of the element isolation layer 14. For that reason, the electric field relaxation layer 15 on the main cell region Rm side is electrically isolated from the electric field relaxation layer 15 on the sense cell region Rs side, and the main cell region Rm and the sense cell region Rs are prevented from being rendered conductive through the electric field relaxation layer 15.

A depth and an impurity concentration of the electric field relaxation layer 15 are arbitrary, and it is preferable that the depth is somewhat deeper and the impurity concentration is higher for the purpose of relaxing the electric field concentration. In this embodiment, the electric field relaxation layer 15 has the same depth and the same impurity concentration as those of the p-type deep layers 9.

The interlayer insulating film 11 is formed on the element isolation layer 14 through a field oxide film 16. The respective source electrodes 10 of the main cell region Rm and the sense cell region Rs are isolated from each other, for example, above the element isolation layer 14, and connected to the external, separately.

In the vicinity of the sense cell region Rs in the main cell region Rm, and in the vicinity of the main cell region Rm in the sense cell region Rs, the p+ type contact regions 5 are formed in an upper layer part of the p-type base region 3. Contact holes are formed in the interlayer insulating film 11 in the p+ type contact regions 5, and the p+ type contact regions 5 are connected to the source electrode 10 through the contact holes. With the above configuration, the p-type base region 3 is fixed to a source potential.

With the above configuration, the SiC semiconductor device in which the MOSFET of the same inverting trench gate structure is disposed in each of the main cell region Rm and the sense cell region Rs is configured. In the MOSFET of the inverting trench gate structure provided in the SiC semiconductor device thus configured, when a gate voltage is applied to the gate electrode 8, a channel is formed on a surface of the p-type base region 3 which comes in contact with each of the trenches 6. With this configuration, after electrons injected from the source electrode 10 pass through a channel extended from the n+ type source regions 4 to the p-type base region 3, the electrons reach the n− type drift layer 2, and a current flows between the source electrode 10 and the drain electrode 12.

The inverting MOSFET described above is formed in each of the main cell region Rm and the sense cell region Rs, and a cell area (the number of cells) of the MOSFETs provided in the main cell region Rm and the sense cell region Rs is set to a predetermined ratio. For that reason, a current obtained by reducing the current flowing in the main cell region Rm at a predetermined rate can flow in the sense cell region Rs. Therefore, a current flowing into the sense cell region Rs is output to the external to enable the current flowing in the main cell region Rm to be sensed.

In the SiC semiconductor device thus configured, as described above, the element isolation layer 14 is provided to electrically isolate the main cell region Rm from the sense cell region Rs, and the electric field relaxation layer 15 is provide to relax the electric field concentration on the bottom of the element isolation layer 14. Further, at least a part of the element isolation layer 14 is arranged inside of the isolation portion of the electric field relaxation layer 15, and the electric field relaxation layer 15 is isolated into the main cell region Rm side and the sense cell region Rs side.

As a result, the electric field concentration below the element isolation layer 14 can be relaxed by the electric field relaxation layer 15 while the element isolation layer 14 is formed between the main cell region Rm and the sense cell region Rs to appropriately perform the element isolation between those regions. Further, the main cell region Rm and the sense cell region Rs can be prevented from being rendered conductive by the electric field relaxation layer 15.

As described above, the electric field relaxation layer 15 is isolated on the bottom of the element isolation layer 14. Alternatively, the element isolation layer 14 and the electric field relaxation layer 15 have any relationships illustrated in FIGS. 2A to 2C. Specifically, the SiC semiconductor device illustrated in FIG. 2A has a structure in which the isolation portion of the electric field relaxation layer 15 is arranged within a width of the element isolation layer 14, and an overall area of the isolation portion of the electric field relaxation layer 15 is cross-linked to the element isolation layer 14. In the above configuration, at least the width of the element isolation layer 14 needs to be set to be larger than a width of the isolation portion of the electric field relaxation layer 15. However, because an overall region of the isolation portion of the electric field relaxation layer 15 is crosslinked to the element isolation layer 14, the overall region of the isolation portion can have an isolation structure, which is preferable. In the SiC semiconductor device illustrated in FIG. 2B, a part of the bottom of the element isolation layer 14 is arranged inside of the isolation portion of the electric field relaxation layer 15, and one corner of the element isolation layer 14 is surrounded by the electric field relaxation layer 15. The SiC semiconductor device illustrated in FIG. 2C has a structure in which the element isolation layer 14 is arranged inside of the isolation portion of the electric field relaxation layer 15. Even in any of those cases, because the electric field relaxation layer 15 is not formed in the overall bottom of the element isolation layer 14, the main cell region Rm and the sense cell region Rs are not rendered conductive through the electric field relaxation layer 15. As described above, at least a part of the element isolation layer 14 may be arranged inside of the isolation portion of the electric field relaxation layer 15, the element isolation layer 14 and the electric field relaxation layer 15 may have any of those configurations in FIGS. 2A to 2C.

Subsequently, a method of manufacturing the SiC semiconductor device according to this embodiment will be described with reference to FIGS. 3A to 3E. In a method of manufacturing the SiC semiconductor device according to this embodiment, processes other than a process for forming the element isolation layer 14 are identical with those in the conventional art. Therefore, the process for forming the element isolation layer 14 will be mainly described.

Figure 3A:
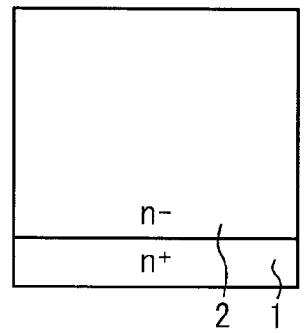
FIG. 3A is a cross-sectional view partially illustrating a process of manufacturing the vicinity of the element isolation layer in the SiC semiconductor device illustrated in FIG. 1.

In a process illustrated in FIG. 3A, the n$^+$ substrate 1 is prepared, and an n$^-$ type drift layer 2 made of SiC is allowed to epitaxially grow on the surface of the n$^+$ type substrate 1. Alternatively, a so-called epitaxial substrate in which the n$^-$ type drift layer 2 made of SiC is epitaxially grown on the surface of the n$^+$ type substrate 1 is prepared. In this way, the semiconductor substrate is prepared. In the semiconductor substrate, the rear surface side is configured by the high concentration impurity layer formed of the n$^+$ type substrate 1, and the front surface side is configured by the n$^-$ type drift layer 2 having a lower impurity concentration than the high concentration impurity layer.

Figure 3B:
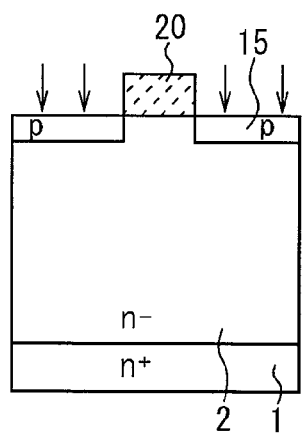
FIG. 3B is a cross-sectional view partially illustrating a process of manufacturing the vicinity of the element isolation layer in the SiC semiconductor device illustrated in FIG. 1.

In a process illustrated in FIG. 3B, after a mask 20 made of LTO has been formed on the surface of the n$^-$ type drift layer 2, a mask 20 is opened in a region where the p-type deep layers 9 and the electric field relaxation layer 15 are to be formed through the photolithography process. Then, p-type impurities (for example, boron or aluminum) are ion-implanted from the mask 20, and thereafter activation is performed through a heat treatment to form the p-type deep layers 9 and the electric field relaxation layer 15. Thereafter, the mask 20 is removed.

Figure 3C:
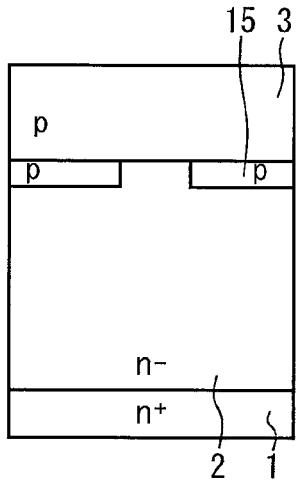
FIG. 3C is a cross-sectional view partially illustrating a process of manufacturing the vicinity of the element isolation layer in the SiC semiconductor device illustrated in FIG. 1.

In a process illustrated in FIG. 3C, a p-type impurity layer is epitaxially grown on the surface of the n$^-$ type drift layer 2 including the surfaces of the p-type deep layers 9 and the electric field relaxation layer 15 to form the p-type base region 3. Although not shown, a mask made of, for example, LTO is formed on the p-type base region 3, and the mask is opened in the region where the n$^+$ type source regions 4 are to be formed through the photolithography process. Thereafter, n-type impurities (for example, nitrogen) are ion-implanted. Subsequently, after the mask used previously has been removed, a mask is again formed, and the mask is opened in a region where the p$^+$ type contact regions 5 are to be formed through the photolithography process. Thereafter, p-type impurities (for example, boron or aluminum) are ion-implanted. Then, after the mask has been removed, the implanted ions are activated to form the n$^+$ type source regions 4 and the p$^+$ type contact regions 5.

Figure 3D:
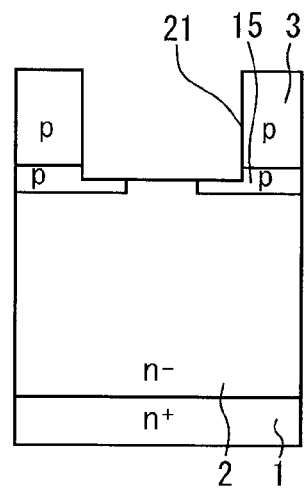
FIG. 3D is a cross-sectional view partially illustrating a process of manufacturing the vicinity of the element isolation layer in the SiC semiconductor device illustrated in FIG. 1.

In a process illustrated in FIG. 3D, after an etching mask not shown has been formed on the surface of the p-type base region 3 including the surfaces of the n$^+$ type source regions 4 and the p$^+$ type contact regions 5, the etching mask is opened in a region where the element isolation layer 14 is to be formed. Although not shown, at the same time, the etching mask is opened even in an area where the trenches 6 are to be formed within the main cell region Rm and the sense cell region Rs. After anisotropic etching using an etching mask has been performed, isotropic etching and a sacrificial oxidation process are performed as occasion demands to form the trenches 6. At the same time, a trench 21 is formed also at a position where the element isolation layer 14 is to be formed. Thereafter, the etching mask is removed.

Figure 3E:
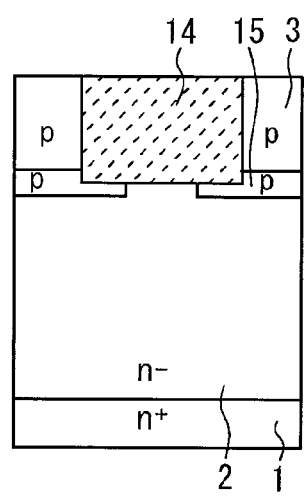
FIG. 3E is a cross-sectional view partially illustrating a process of manufacturing the vicinity of the element isolation layer in the SiC semiconductor device illustrated in FIG. 1.

In a process illustrated in FIG. 3E, a process for forming the gate insulating film 7 and a process for forming the element isolation layer 14 are performed simultaneously. Specifically, after heat oxidation has been performed through a pyrogenic method using a wet atmosphere, an oxide film is formed to be embedded in the trenches 6 and 21 through a CVD technique. A mask not shown is arranged, and a portion of the mask corresponding to each trench 6 is opened by a photolithography process. Thereafter, anisotropic etching is performed with the use of the mask to partially remove the oxide film in the trench 6. As a result, an oxide film having a desired thickness remains on side surfaces and a bottom of the trench 6 to configure the gate insulating film 7. In this situation, since the oxide film formed in the trench 21 is covered with the mask, even after the oxide film in the trench 6 has been partially removed, the oxide film in the trench 21 is left, and the element isolation layer 14 is formed by the oxide film.

Because the subsequent processes are identical with those in the conventional art, those processes are not shown, but the following processes are performed. Specifically, after a polysilicon layer doped with n-type impurities has been formed on the surface of the gate insulating film 7, an etch-back process is conducted, to thereby form the gate electrode 8 on the surface of the gate insulating film 7 in the trench 6. Subsequently, after the field oxide film 16 and the interlayer insulating film 11 have been formed, the interlayer insulating film 11 is patterned to form contact holes connected to the n$^+$ type source region 4 and the p$^+$ type contact region 5. Also, a contact hole connected to the gate electrode 8 is formed in another cross section. Subsequently, after an electrode material film is formed to be embedded in the contact holes, the electrode material is patterned to form the source electrode 10 and the gate line. The drain electrode 12 is formed on a rear surface side of the n$^+$ type substrate 1. With the above processes, the SiC semiconductor device having the inverting MOSFET illustrated in FIG. 1 is completed.

As described above, in this embodiment, the element isolation layer 14 is disposed to electrically isolate the main cell region Rm from the sense cell region Rs. While the electric field relaxation layer 15 is provided to relax the electric field concentration on the bottom of the element isolation layer 14, the electric field relaxation layer 15 is isolated into the main cell region Rm side and the sense cell region Rs side in the element isolation layer 14.

As a result, the electric field concentration below the element isolation layer 14 can be relaxed by the electric field relaxation layer 15 while the element isolation layer 14 is formed between the main cell region Rm and the sense cell region Rs to appropriately perform the element isolation between those regions. Further, the main cell region Rm and the sense cell region Rs can be prevented from being rendered conductive through the electric field relaxation layer 15.

According to the above manufacturing method, the process for forming the electric field relaxation layer 15 is performed together with the process for forming the p-type deep layers 9, and the process for forming the element isolation layer 14 is performed together with the process of forming the trenches 6 and the process for forming the gate insulating film 7. For that reason, the manufacturing process can be simplified, and both of the processes for forming the electric field relaxation layer 15 and the element isolation layer 14 also serve as a part of the process for forming the MOSFET, resulting in no need to add a process necessary only to form those layers. Therefore, the element isolation structure between the main cell region Rm and the sense cell region Rs can be formed without any addition of the manufacturing processes.

Second Embodiment

A second embodiment of the present disclosure will be described. this embodiment is made taking the method of forming the element isolation layer 14 when the off-substrate is used into consideration in the first embodiment. Because a basic structure is identical with that in the first embodiment, only portions different from those in the first embodiment will be described.

In the SiC semiconductor device, the element formation is performed with the off-substrate to facilitate a step-flow growth. When an off-substrate of which a main surface has an off-angle of a predetermined angle (for example, 4 degrees) is used as the $n^+$ type substrate 1, a state of the surface is inclined by an off-angle and inherited when the $n^-$ type drift layer 2 and the p-type base region 3 epitaxially grow on the $n^+$ type substrate 1. That is, the state of the surface is inherited in a direction perpendicular to a just plane of the $n^+$ type substrate 1, but not inherited in a direction perpendicular to the main surface of the $n^+$ type substrate 1. For that reason, when an alignment mark for mask matching at the time of implanting ions is configured by, for example, a concave portion, the alignment mark is deviated together with the epitaxial growth.

Figure 2A:
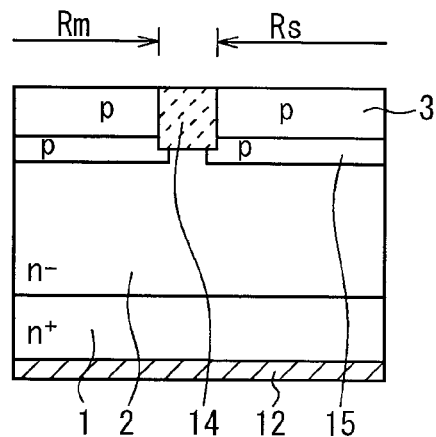
FIG. 2A is a diagram illustrating an example of a relationship between an element isolation layer and an electric field relaxation layer in the SiC semiconductor device illustrated in FIG. 1.
Figure 2B:
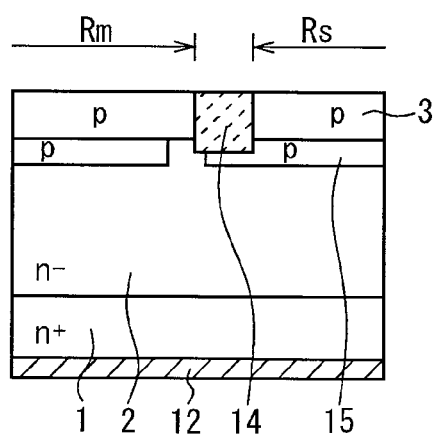
FIG. 2B is a diagram illustrating an example of the relationship between the element isolation layer and the electric field relaxation layer in the SiC semiconductor device illustrated in FIG. 1.
Figure 2C:
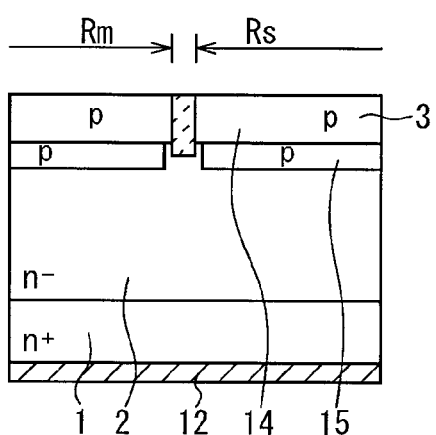
FIG. 2C is a diagram illustrating an example of the relationship between the element isolation layer and the electric field relaxation layer in the SiC semiconductor device illustrated in FIG. 1.
Figure 4A:
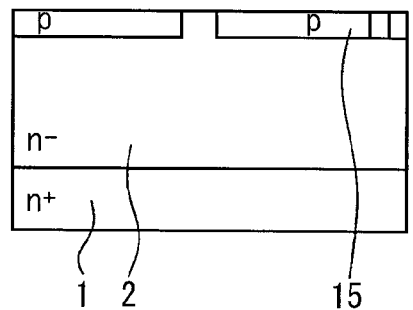
FIG. 4A is a diagram illustrating the deviation of an alignment mark when an $n^+$ type substrate is set to an off substrate.
Figure 4B:
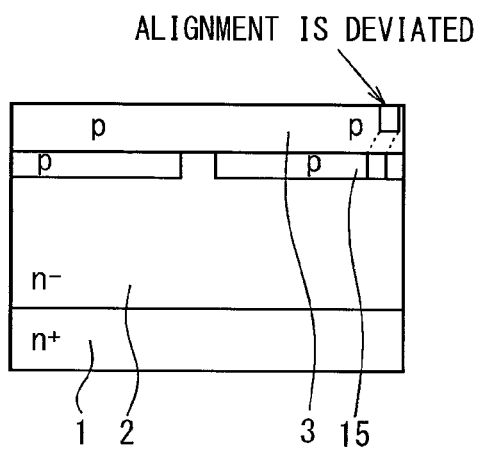
FIG. 4B is a diagram illustrating the deviation of the alignment mark when the $n^+$ type substrate is set to the off substrate.
Figure 4C:
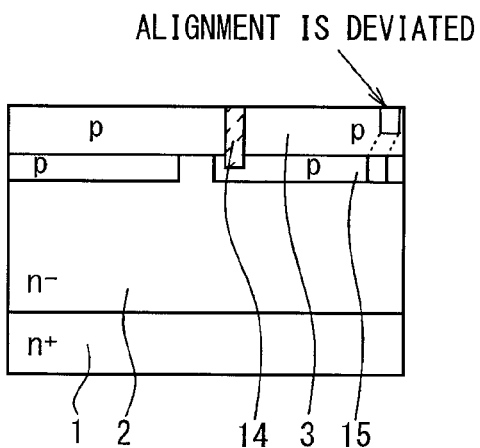
FIG. 4C is a cross-sectional view illustrating the deviation of the alignment mark when the $n^+$ type substrate is set to the off substrate.

For example, when the SiC semiconductor device is formed through the manufacturing method described in the above first embodiment, the alignment mark used in forming the p-type deep layer 9 and the electric field relaxation layer 15 as illustrated in FIG. 4A is deviated in forming the p-type base region 3 as illustrated in FIG. 4B. For that reason, as illustrated in FIG. 4C, when the element isolation layer 14 is formed with reference to the alignment mark, a formation position of the trench 21 is also deviated due to the deviation of the alignment mark. With the above state, because the formation positions of the element isolation layer 14 and the electric field relaxation layer 15 are deviated from each other, there is a possibility that the above-mentioned relationships of FIGS. 2A to 2C are not satisfied. Therefore, in this embodiment, dimensions of the respective parts are set so that a relationship of the formation positions of the element isolation layer 14 and the electric field relaxation layer 15 satisfies the relationship of FIG. 2A or 2B even if the alignment mark is deviated. This operation will be described with reference to FIG. 5.

Figure 5:
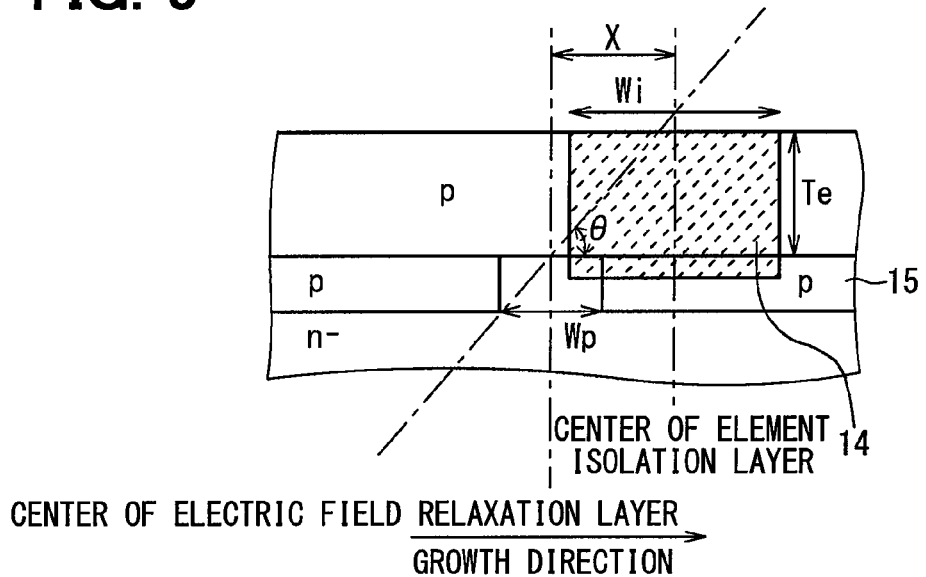
FIG. 5 is a cross-sectional view illustrating a relationship between the deviation of the alignment mark and formation positions of the element isolation layer and the electric field relaxation layer.

As illustrated in FIG. 5, when it is assumed that the amount of deviation of the alignment mark is x, a thickness of the p-type base region 3 is Te, and an off-angle is θ, the amount of deviation x is represented by the following expression. It is assumed that 0°<θ<90°.

$$X = Te/\tan θ \quad [\text{Ex. 1}]$$

Also, in order that the relationship in the formation position between the element isolation layer 14 and the electric field relaxation layer 15 satisfies the relationship in FIG. 2A or 2B, the amount of deviation x is smaller than a sum of distances between a center of the element isolation layer 14 and a center between the isolated electric field relaxation layers 15. For that reason, when it is assumed that an interval of the electric field relaxation layers 15 isolated between the main cell region Rm and the sense cell region Rs is Wp, and a width of the element isolation layer 14 is Wi, the following expression needs to be satisfied.

$$Wi/2 > x - Wp/2 > 0 \quad [\text{Ex. 2}]$$

Therefore, if the width Wi of the element isolation layer 14 satisfies the following expression by the above Expressions 1 and 2, a relationship in the formation position between the element isolation layer 14 and the electric field relaxation layer 15 can satisfy the relationship of FIG. 2A or 2B.

$$Wi > 2Te/\tan θ - Wp > 0 \quad [\text{Ex. 3}]$$

As described above, the width Wi of the element isolation layer 14 and the width Wp of the isolation portion of the electric field relaxation layer 15 are set to satisfy Expression 3 whereby at least a part of the element isolation layer 14 can be arranged inside of the isolation portion of the electric field relaxation layer 15. With the above configuration, even when the SiC semiconductor device is formed with the off-substrate, the electric field relaxation layer 15 can be surely isolated into the main cell region Rm side and the sense cell region Rs side within the width of the element isolation layer 14, and the advantages described in the first embodiment can be obtained.

Third Embodiment

A third embodiment of the present disclosure will be described. In this embodiment, the process for forming the element isolation layer 14 changes in the first embodiment, and other configurations are identical with those in the first embodiment. Therefore, only portions different from those in the first embodiment will be described.

A method for manufacturing the SiC semiconductor device according to this embodiment will be described with reference to FIGS. 6A to 6D. Processes other than the process for forming the element isolation layer 14 in the method of manufacturing the SiC semiconductor device according to this embodiment are identical with those in the first embodiment. Therefore, the same portions as those in the first embodiment will be omitted from description with reference to FIGS. 3A to 3C.

Figure 6A:
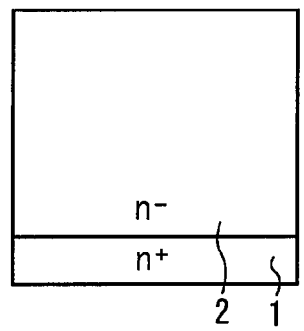
FIG. 6A is a cross-sectional view partially illustrating a process of manufacturing the vicinity of an element isolation layer in an SiC semiconductor device according to a third embodiment of the present disclosure.
Figure 6B:
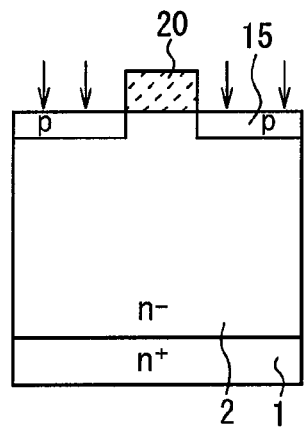
FIG. 6B is a cross-sectional view partially illustrating a process of manufacturing the vicinity of the element isolation layer in the SiC semiconductor device according to the third embodiment of the present disclosure.
Figure 6C:
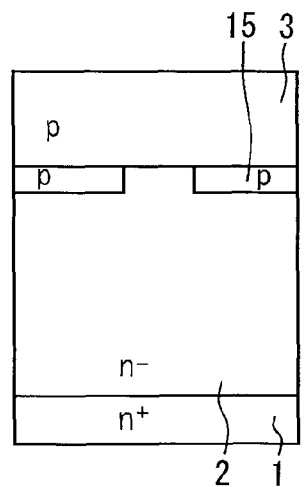
FIG. 6C is a cross-sectional view partially illustrating a process of manufacturing the vicinity of the element isolation layer in the SiC semiconductor device according to the third embodiment of the present disclosure.
Figure 6D:
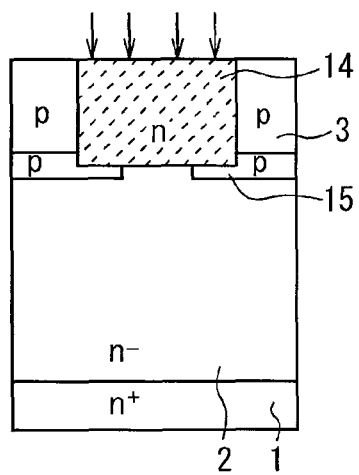
FIG. 6D is a cross-sectional view partially illustrating a process of manufacturing the vicinity of the element isolation layer in the SiC semiconductor device according to the third embodiment of the present disclosure.
Figure 7A:
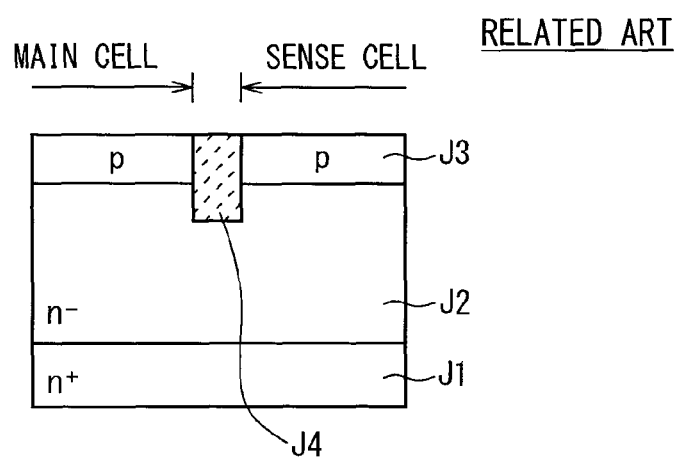
FIG. 7A is a cross-sectional view illustrating an example of a semiconductor device having a structure in which a main cell and a sense cell are element-isolated from each other.
Figure 7B:
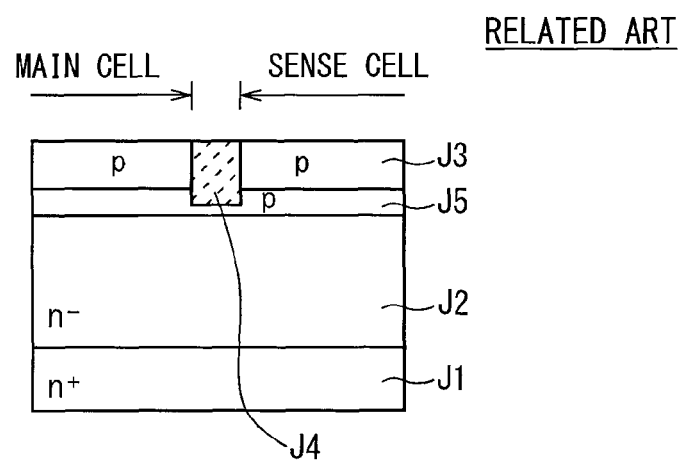
FIG. 7B is a cross-sectional view of the semiconductor device having a p-type electric field relaxation layer while element-isolating the main cell and the sense cell.

First, in the processes illustrated in FIGS. 6A to 6C, the same processes as those in FIGS. 3A to 3C are performed, the p-type deep layers 9 and the electric field relaxation layer 15 are formed after the $n^-$ type drift layer 2 has been formed on the surface of the $n^+$ type substrate 1, and the p-type base region 3 is further formed. Then, in a process illustrated in FIG. 6D, a mask not shown is arranged on the p-type base region 3, and a position of the mask where the element isolation layer 14 is to be formed is opened by a photolithography process. Thereafter, n-type impurities are implanted from the mask. In this situation, a dose amount of the n-type impurities is set so that a region into which the p-type impurities contained in the p-type base region 3 are returned and ion-implanted become i-type or n-type. As a result, the ion-implanted region partially becomes the conductivity type different from that of the p-type base region 3 to configure the element isolation layer 14.

As described above, the element isolation layer 14 can be formed by the ion implantation. The element isolation layer 14 is not configured by an insulating film, but configured by the i-type or n-type semiconductor layer which is the conductivity type different from that of the p-type base region 3. Therefore, isolation can be performed between the main cell region Rm and the sense cell region Rs.

OTHER EMBODIMENTS

The present disclosure is not limited to the above embodiments, but can appropriately change within a scope of the claims.

For example, in the above embodiments, the SiC semiconductor device in which the MOSFET of the inverting trench gate structure is formed as an element has been described, but is not limited to that configuration. For example, the MOSFET may be a planar MOSFET, or an accumulation type MOSFET in which a channel region is formed in an n-type channel layer formed on a surface of a portion of the p-type base region 3 located between the n-type drift layer 2 and the n$^+$ type source regions 4. The case in which the p-type base region 3 is allowed to epitaxially grow on the n$^-$ type drift layer 2 has been described. Alternatively, the p-type base region 3 may be formed by ion implantation.

Further, in the above embodiment, a structure in which the n$^-$ type drift layer 2 is formed on the surface of the n$^+$ type substrate 1 has been exemplified as the semiconductor substrate in which the rear surface side is the high concentration impurity layer, and the front surface side is a drift layer having the impurity concentration lower than the high concentration impurity layer. However, the above configuration is merely an example of the semiconductor substrate. For example, the semiconductor substrate may configure the high concentration impurity layer by ion-implanting the n-type impurities on the rear surface side of the substrate configured by the n$^-$ type drift layer 2, or epitaxial growth.

Also, in the above respective embodiments, the MOSFET of the n-channel type in which the first conductivity type is n-type, and the second conductivity type is p-type has been described as an example. Alternatively, this disclosure can be applied to the MOSFET of the p-channel type in which the conductivity type of the respective components is reversed.

The invention claimed is:

1. A silicon carbide semiconductor device comprising:
a plurality of MOSFETs that are respectively arranged in a main cell region and a sense cell region,
each of the MOSFETs arranged in a same semiconductor substrate made of silicon carbide, including:
a high concentration impurity layer on a rear surface side of the substrate;
a drift layer with a drift impurity concentration lower than the high concentration impurity layer on a front surface side of the substrate, and is made of silicon carbide having a first conductivity type;
a base region that is arranged on the drift layer, and is made of silicon carbide having a second conductivity type;
a source region that is arranged in an upper layer part of the base region, and is made of silicon carbide having the first conductivity type with a source impurity concentration higher than the drift layer;
a gate insulating film that is arranged on a surface of a channel region, the channel region being disposed in a surface layer part or on a surface of a portion of the base region located between the source region and the drift layer;
a gate electrode that is arranged on a surface of the gate insulating film;
a source electrode that is electrically connected to the source region; and
a drain electrode that is electrically connected to the high concentration impurity layer on the rear surface side of the semiconductor substrate;
an element isolation layer that is arranged, extending from a surface of the base region to be deeper than the base region, between the main cell region and the sense cell region, and isolates the main cell region from the sense cell region; and
an electric field relaxation layer that has the second conductivity type, and is arranged extending from a bottom of the base region to be deeper than the element isolation layer,
wherein the electric field relaxation layer is divided into a main cell region portion and a sense cell region portion,
wherein the main cell region portion of the electric field relaxation layer is spaced apart from the sense cell region portion of the electric field relaxation layer by a gap, wherein a division portion is formed in the gap between the main cell region portion and the sense cell region portion, such that the division portion contains at least part of the drift layer,
wherein at least a part of the element isolation layer is arranged inside of the division portion,
wherein the element isolation layer isolates between the main cell region and the sense cell region,
wherein the element isolation layer is made of an insulating film, wherein the gate insulating film is distinct from the element isolation layer,
wherein the maximum width of the element isolation layer is larger than the maximum width of the gate insulating film,
wherein the element isolation layer directly contacts the electric field relaxation layer, and
wherein the element isolation layer directly contacts the division portion.

2. The silicon carbide semiconductor device according to claim 1,
wherein the high concentration impurity layer in the semiconductor substrate has an offset-angle,
wherein the offset-angle is defined as an angle between a <0001> crystal axis and a direction perpendicular to a top surface of the semiconductor substrate,
wherein the drift layer and the base region are epitaxially grown on the surface of the high concentration impurity layer in turn, and inherit the offset-angle,
wherein a width of the element isolation layer is defined as Wi, a width of the division portion is defined as Wp, a thickness of the base region is defined as Te, and the offset-angle is defined as θ, and wherein the width of Wi of the element isolation layer and the width as Wp of the division portion have dimensions satisfying a relationship of:

$Wi > 2Te/\tan\theta - Wp > 0$.

3. The silicon carbide semiconductor device according to claim 1,
wherein a width of the element isolation layer is larger than a width of the electric field relaxation layer, the division portion overlaps vertically with the element isolation layer, and an entire region of the division portion is cross-linked between the element isolation layer and the electric field relaxation layer.

4. The silicon carbide semiconductor device according to claim 1,
wherein a part of a bottom of the element isolation layer is arranged inside of the division portion, and one corner of the element isolation layer is surrounded by the electric field relaxation layer.

5. The silicon carbide semiconductor device according to claim 1,
wherein the element isolation layer is made of an insulating film.

6. The silicon carbide semiconductor device according to claim 5,
wherein a first trench is arranged from a surface of the source region to be deeper than the base region, the gate insulating film is arranged on an inner wall of the trench, and the gate electrode is arranged on a surface of the gate insulating film in the trench,
wherein a second trench is arranged from the surface of the source region in a location different from the first trench, and the element isolation layer is arranged in the second trench, and
wherein the second trench has a same depth as the first trench.

7. The silicon carbide semiconductor device according to claim 1,
wherein the element isolation layer is configured by ion-implanting an impurity, having a conductivity type different from the base region, into a part of the base region.

8. The silicon carbide semiconductor device according to claim 1,
wherein the electric field relaxation layer is formed adjacent to the base layer.

9. The silicon carbide semiconductor device according to claim 1,
wherein the main cell region portion and the sense cell region portion are element-isolated from each other, and are electrically isolated from each other.

10. The silicon carbide semiconductor device according to claim 1,
wherein the electric field relaxation layer is arranged extending directly from a bottom of the base region to be deeper than the element isolation layer.

11. The silicon carbide semiconductor device according to claim 1,
wherein the division portion is formed at least partly in the drift layer.

12. The silicon carbide semiconductor device according to claim 1,
wherein a thickness of the element isolation layer in a direction perpendicular to a top surface of the semiconductor substrate is larger than a thickness of the electric field relaxation layer.

13. The silicon carbide semiconductor device according to claim 1,
wherein the element isolation layer is made of only an insulating film.

14. The silicon carbide semiconductor device according to claim 1,
wherein the element isolation layer is the insulating film fully filling a trench filling an area between the main cell region and the sense cell region, the trench being defined by sidewalls of the element isolation layer.

15. The silicon carbide semiconductor device according to claim 1,
wherein the main cell region and the sense cell region are independent from each other.

16. The silicon carbide semiconductor device according to claim 1,
wherein the element isolation layer is configured to electrically isolate the main cell region from the sense cell region.

17. The silicon carbide semiconductor device according to claim 1, wherein:
the maximum vertical thickness of the element isolation layer is larger than the maximum vertical thickness of the gate insulating film.

18. The silicon carbide semiconductor device according to claim 1, wherein:
the element isolation layer is embedded in a first trench formed in the base region and the drift layer; and
the gate insulating film is embedded in a second trench formed in the base region and the drift layer.

19. The silicon carbide semiconductor device according to claim 18, wherein:
an inside of the first trench is fully filled with the element isolation layer.

* * * * *